United States Patent
Tsai et al.

(10) Patent No.: US 8,767,164 B2
(45) Date of Patent: Jul. 1, 2014

(54) THIN FILM TRANSISTOR SUBSTRATE AND DISPLAY APPARATUS USING THE SAME AND MANUFACTURING METHOD THEREOF

(75) Inventors: Chi-Che Tsai, Miao-Li County (TW); Wei-Yen Wu, Miao-Li County (TW); Po-Ching Lin, Miao-Li County (TW)

(73) Assignee: Chimei Innolux Corporation (TW)

( * ) Notice: Subject to any disclaimer, the term of this patent is extended or adjusted under 35 U.S.C. 154(b) by 57 days.

(21) Appl. No.: 13/349,338

(22) Filed: Jan. 12, 2012

(65) Prior Publication Data

US 2012/0187406 A1 Jul. 26, 2012

(30) Foreign Application Priority Data

Jan. 20, 2011 (TW) ............... 100102171 A

(51) Int. Cl.
*G02F 1/1333* (2006.01)
(52) U.S. Cl.
USPC ............... 349/158; 349/138; 349/187
(58) Field of Classification Search
USPC ......... 349/158, 159, 138, 43, 187, 58; 445/24
See application file for complete search history.

(56) References Cited

U.S. PATENT DOCUMENTS

| 7,393,581 | B2 | 7/2008 | Kim et al. |
| 7,486,373 | B2 * | 2/2009 | Lee et al. ............... 349/158 |
| 7,568,961 | B2 | 8/2009 | Kim |
| 7,656,497 | B2 | 2/2010 | Lee et al. |
| 2008/0053604 | A1 | 3/2008 | Kim et al. |
| 2010/0143681 | A1 | 6/2010 | Yan et al. |
| 2010/0157180 | A1 * | 6/2010 | Doane et al. ............... 349/25 |

FOREIGN PATENT DOCUMENTS

| CN | 1896806 | 1/2007 |
| CN | 1928637 | 3/2007 |
| TW | 200706951 | 2/2007 |
| TW | I287298 | 9/2007 |
| TW | 200915574 | 4/2009 |

OTHER PUBLICATIONS

Office Action dated Feb. 21, 2014 from corresponding application No. TW100102171.

* cited by examiner

*Primary Examiner* — Thoi Duong
(74) *Attorney, Agent, or Firm* — Lowe Hauptman & Ham, LLP

(57) ABSTRACT

A thin film transistor substrate, a display apparatus using the same and a manufacturing method thereof are provided. The display apparatus includes a thin film transistor substrate, a top substrate and a display medium layer. The thin film transistor substrate includes a composite plate and several thin film transistors. The composite plate includes a core material structure and two insulation structures. The core material structure includes a metal layer. The two insulation structures are respectively disposed at two sides of the core material structure so as to sandwich the core material structure therebetween. The thin film transistors are disposed on the composite plate. The display medium layer is disposed between the thin film transistor substrate and the top substrate.

13 Claims, 10 Drawing Sheets

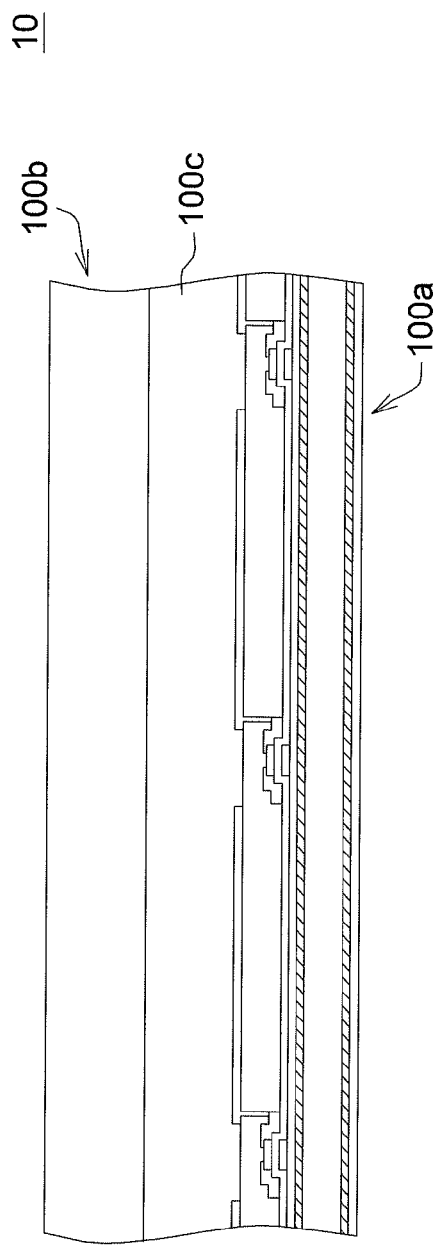
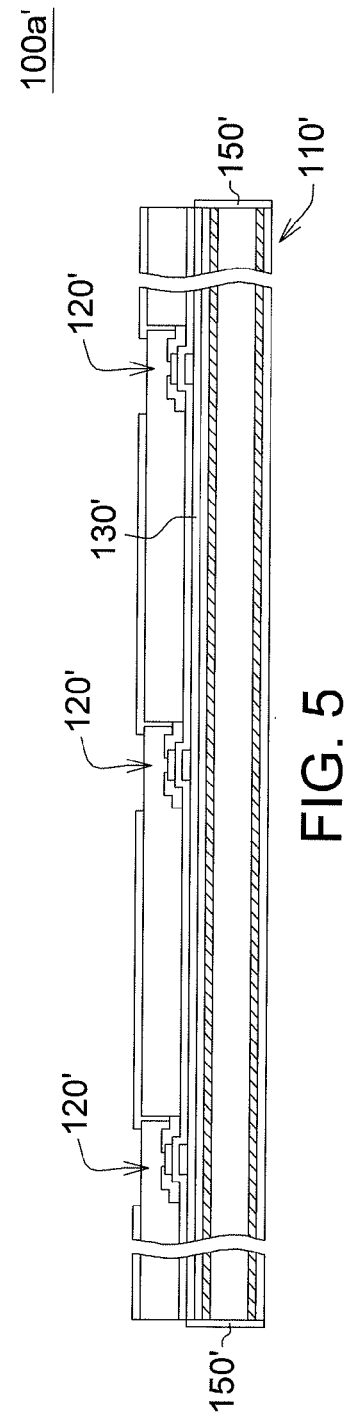
FIG. 4
FIG. 5

THIN FILM TRANSISTOR SUBSTRATE AND DISPLAY APPARATUS USING THE SAME AND MANUFACTURING METHOD THEREOF

This application claims the benefit of Taiwan application Serial No. 100102171, filed Jan. 20, 2011, the subject matter of which is incorporated herein by reference.

BACKGROUND OF THE INVENTION

1. Field of the Invention

The invention relates in general to a thin film transistor substrate, a display apparatus using the same and a manufacturing method thereof, and more particularly to a thin film transistor substrate with a composite plate, a display apparatus using the same and a manufacturing method thereof.

2. Description of the Related Art

As the application of display apparatus is getting more and more popular, the research and development in the elements has become one of the prominent tasks for manufacturers. Originally, most display apparatus adopts glass substrate due to its excellent performance in transparency, surface flatness, water/oxygen resistance and dimension stability (that is, low coefficient of thermal expansion). However, glass substrate is not suitable for flexible or impact resistant display apparatus for its poor strength, fragility and poor flexibility. Currently, some display apparatus replace glass substrate with plastic substrate to achieve better performance in toughness, strength, specific weight and flexibility.

However, plastic substrate cannot achieve the same performance with glass substrate in temperature resistance, chemical resistance, water/oxygen resistance and dimension stability. Particularly, the performance of plastic substrate requires low-temperature or other specific manufacturing ways for passing existing manufacturing specifications. Besides, since water and oxygen are critical to stability and lifespan of electronic elements, poor water/oxygen resistance makes the properties of the product hard to maintain. In addition, the plastic substrate has poor rigidity, the bending level of the plastic substrate hard to meet the operation specifications of existing manufacturing machines even when the thickness is close to glass substrate. Therefore, the plastic substrate must be combined with a rigidity carrier in process. After process finished, the rigidity carrier and the plastic substrate need to be separated, incurring additional materials and costs.

Some manufacturers try to replace glass substrate with metal foil to provide excellent performance in terms of rigidity, strength, toughness, flexibility, temperature resistance, chemical resistance, water/oxygen resistance and dimension stability. However, metal having large specific weight, metal plate cannot meet the lightweight requirement of display. In order to reduce the weight, after process finished, thin film transistors are covered by a protection layer and the bottom surface of metal plate is etched and thinned to obtain a metal foil. Thus, using metal foil incurs high cost and transistors may be damaged during the etching/thinning process. Thus, find some material to replace glass substrate has become a prominent task for the industries.

SUMMARY OF THE INVENTION

The invention is related to a thin film transistor substrate, a display apparatus using the same and a manufacturing method thereof. A composite plate of the display apparatus is used as a substrate for carrying thin film transistors, wherein the composite plate replaces the glass substrate without changing existing manufacturing equipment and specifications, and possesses the advantages of both plastic substrate and metal foil. The display apparatus can be reflective, self-luminous or other non-transmissive type one.

According to the first aspect of present invention, a thin film transistor substrate is provided. The thin film transistor substrate includes a composite plate and several thin film transistors. The composite plate includes a core material structure and two insulation structures. The core material structure includes a metal layer. The two insulation structures are respectively disposed at two sides of the core material structure so as to sandwich the core material structure therebetween. The thin film transistors are disposed on the composite plate.

According to the second aspect of present invention, a display apparatus is provided. The display apparatus includes a thin film transistor substrate, a top substrate and a display medium layer. The thin film transistor substrate includes a composite plate and several thin film transistors. The composite plate includes a core material structure and two insulation structures. The core material structure includes a metal layer. The two insulation structures are respectively disposed at two sides of the core material structure so as to sandwich the core material structure therebetween. The thin film transistors are disposed on the composite plate. The display medium layer is disposed between the thin film transistor substrate and the top substrate.

According to the third aspect of present invention, a manufacturing method of a display apparatus including the following steps is provided. A composite plate including a core material structure and two insulation structures is provided, wherein the core material structure includes a metal layer, and the two insulation structures are respectively disposed at two sides of the core material structure so as to sandwich the core material structure therebetween. Several thin film transistors are formed on the composite plate so as to form a thin film transistor substrate. A top substrate is provided. A display medium layer is formed between the thin film transistor substrate and the top substrate.

The above and other aspects of the invention will become better understood with regard to the following detailed description of the non-limiting embodiment(s). The following description is made with reference to the accompanying drawings.

BRIEF DESCRIPTION OF THE DRAWINGS

FIG. 4 shows a cross-sectional view of a display apparatus according to the first embodiment of the invention;

FIG. 5 shows a cross-sectional view of another thin film transistor substrate according to the first embodiment of the invention;

DETAILED DESCRIPTION OF THE INVENTION

First Embodiment

Figure 1:
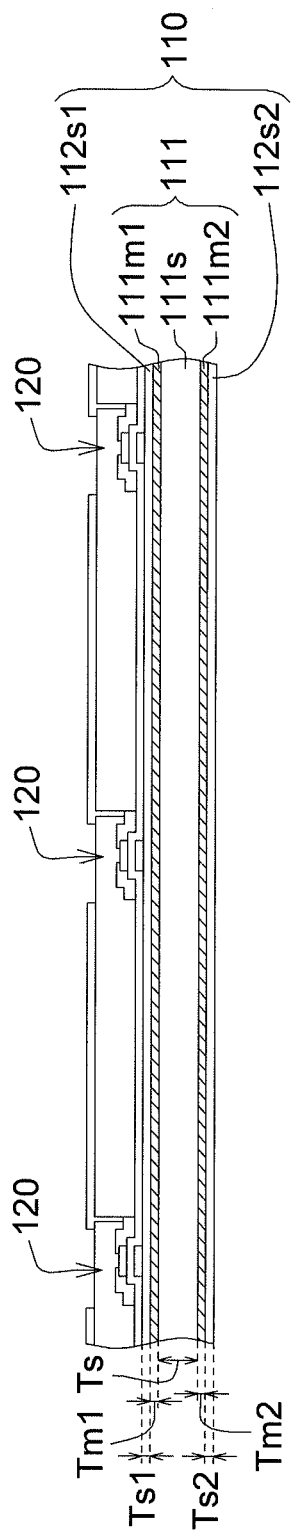
FIG. 1 shows a cross-sectional view of a thin film transistor substrate according to a first embodiment of the invention.

Referring to FIG. 1, a cross-sectional view of a thin film transistor substrate according to a first embodiment of the invention is shown. The thin film transistor substrate $100a$ includes a composite plate 110 and several thin film transistors 120. The thin film transistors 120 are disposed on the composite plate 110.

In the present embodiment of the invention, the composite plate 110 includes a core material structure 111 and two insulation structures $112s1$ and $112s2$. The two insulation structures $112s1$ and $112s2$ are respectively disposed at two sides of the core material structure 111 so as to sandwich the core material structure 111 therebetween. The core material structure 111 includes an insulation layer $111s$ and two metal layers $111m1$ and $111m2$. The metal layers $111m1$ and $111m2$ are respectively disposed at two sides of the insulation layer $111s$ so as to sandwich the insulation layer $111s$ therebetween.

In general, the core material structure 111 of the composite plate 110 has high strength and stiffness for bearing the loading and bending applied thereto. In addition, the insulation structures $112s1$ and $112s2$ are used for insulation purpose and for enhancing the buffering capacity of the structure. Since the composite plate 110 of the present embodiment carries the thin film transistors 120, the insulation structures $112s1$ and $112s2$ disposed at the outer sides need chemical resistance to avoid being damaged when contacting chemicals, such as washing agent, etching solvent or developing solvent during the manufacturing process of the thin film transistors 120.

The composite plate 110 of the present embodiment of the invention is further elaborated below. Firstly, in terms of the material for each layer of the composite plate 110, the insulation structures $112s1$ and $112s2$ and the insulation layer $111s$ are all made of glass fiber fabric, and the metal layers $111m1$ and $111m2$ are made of copper foil so as to possess excellent bonding property. Here, the glass transition temperature (Tg) at the resin of the glass fiber fabric is higher than 170° C. and is thus applicable to the low-temperature growth manufacturing process of the thin film transistors 120. Suppose the production line is 3.5 generation and the dimension of the substrate is 620 mm×750 mm. In terms of the ratio between the thicknesses among the layers of the composite plate 110, the ratio of the total thickness of the metal layers $111m1$ and $111m2$ to the total thickness of the insulation structures $112s1$ and $112s2$ and the insulation layer $111s$ is 1:10. Moreover, the ratio of the thickness of the insulation layer $111s$ to the total thickness of the insulation structures $112s1$ and $112s2$ is 4.7~5.3:1. That is, suppose the thicknesses of the insulation structures $112s1$, the metal layer $111m1$, the insulation layer $111s$, the metal layer $111m2$ and the insulation structure $112s2$ are respectively denoted by Ts1, Tm1, Ts, Tm2 and Ts2, then the ratio (Tm1+Tm2):(Ts1+Ts2+Ts)=1:10, and the ratio Ts:(Ts1+Ts2)=4.7~5.3:1. Based on the ratios of the thicknesses, the bending dimensions of the composite plate 110 and glass substrate can be estimated according to the Stoney's equation to compare the rigidity of the composite plate 110 and the rigidity of glass substrate. The estimation shows that the bending dimension of 0.73 mm composite plate 110 is similar to that of 0.5 mm glass substrate, and the weight of the composite plate 110 is about 900 g. Thus, it can be estimated that the rigidity of the 0.73 mm composite plate 110 is similar to that of the 0.5 mm glass substrate.

Figure 2:
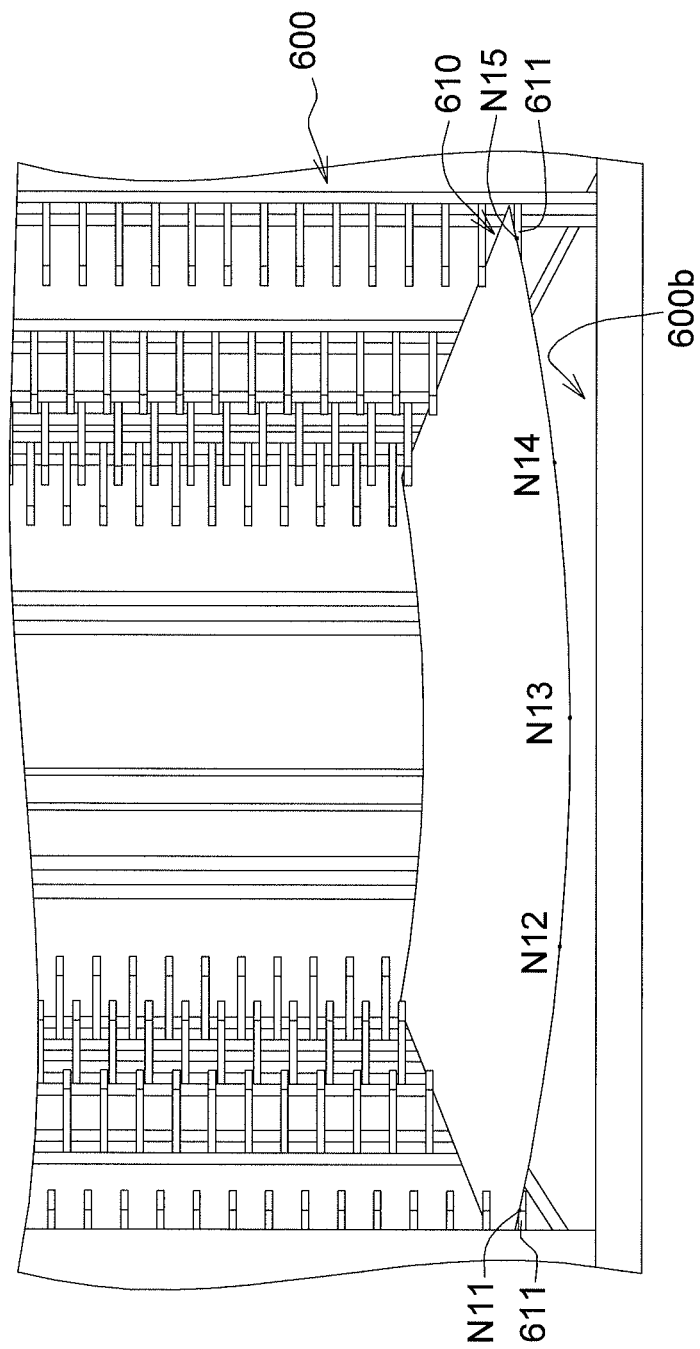
FIG. 2 shows a schematic diagram of the actual sample of the composite plate being placed at a first cell of a cassette according to the first embodiment of the invention.

An actual sample of the composite plate 110 formed according to the above conditions is placed in a cassette for description purpose. Referring to FIG. 2 and Table 1, a schematic diagram of the actual sample of the composite plate 110 being placed at a first cell 610 of a cassette 600 according to the first embodiment of the invention is shown in FIG. 2, and the distances from the positions N11~N15 to the bottom $600b$ of the cassette 600 when the actual sample of the composite plate 110 is placed at the first cell 610 of the cassette 600 are listed in Table 1.

TABLE 1

| | Position N11 | Position N12 | Position N13 | Position N14 | Position N15 |
|---|---|---|---|---|---|
| Distance (mm) to the bottom 600b of the cassette 600 | 45.0 | 34.5 | 28.5 | 33.5 | 45.0 |

Two opposite sides of the actual sample of the composite plate 110 are disposed at the supporting portions 611 of the first cell 610 of the cassette 600, so that the positions N11 and N15 of the actual sample of the composite plate 110 respectively denote the positions of the actual sample of the composite plate 110 at the supporting portions 611, and the position N13 denotes the central bending position of the actual sample of the composite plate 110.

In a conventional thin film transistor substrate, the thin film transistors are carried by a glass substrate. During the manufacturing process, the glass substrate is normally placed in a cassette for delivery and supported by supporting portions of the cassette at two opposite sides. In other words, the central portion of the glass substrate is not supported, and will be bent towards the bottom of the cassette due to the effect of gravity. To avoid an over-bent glass substrate being cracked or damaged due to the collision with the robot arm, it is necessary to set certain specifications regarding the maximum bending dimension of the glass substrate. When a 0.5 mm glass substrate is placed at the first cell, the distance from the central bending portion (that is, the position with the maximum degree of bending) of the glass substrate to the bottom of the cassette ranges 24~37 mm setting as a specification for the manufacturing machines. Current 0.5 mm glass substrate to the bottom of the cassette is about 29 mm.

As shown in Table 1, the distance (28.5 mm) from the central bending portion (position N13) of the actual sample of the composite plate 110 according to the present embodiment of the invention placed at the first cell 610 of the cassette 600 to the bottom $600b$ of the cassette 600 is close to that of the 0.5 mm glass substrate. Since the thickness of the substrate is within the range of 0.1 mm~1.0 mm predetermined according to the manufacturing process, the thickness of the composite plate 110 is conformed to the specification. Therefore, the composite plate 110 of the present embodiment of the invention can replace the 0.5 mm glass substrate for carrying the thin film transistors 120 without changing the existing machines and specifications.

In comparison to an ordinary glass substrate, the composite plate 110 whose flexural modulus normally ranges 20~25 GPa is more durable and can bear stronger bending force, so that likelihood of being damaged by the collision or suppression which arises during delivery is reduced, and flexibility and impact resistance of the display apparatus is improved. Furthermore, since the composite plate 110 of the present embodiment of the invention is a symmetric structure, the composite plate 110, which may include various materials with different coefficients of thermal expansion, still effectively avoids the occurrence of warpage during baking or heating process. Besides, the composite plate 110 of the present embodiment of the invention, which includes two metal layers 111m1 and 111m2, has better performance in water/oxygen resistance, temperature resistance and thermal stability than plastic substrate.

Figure 3:
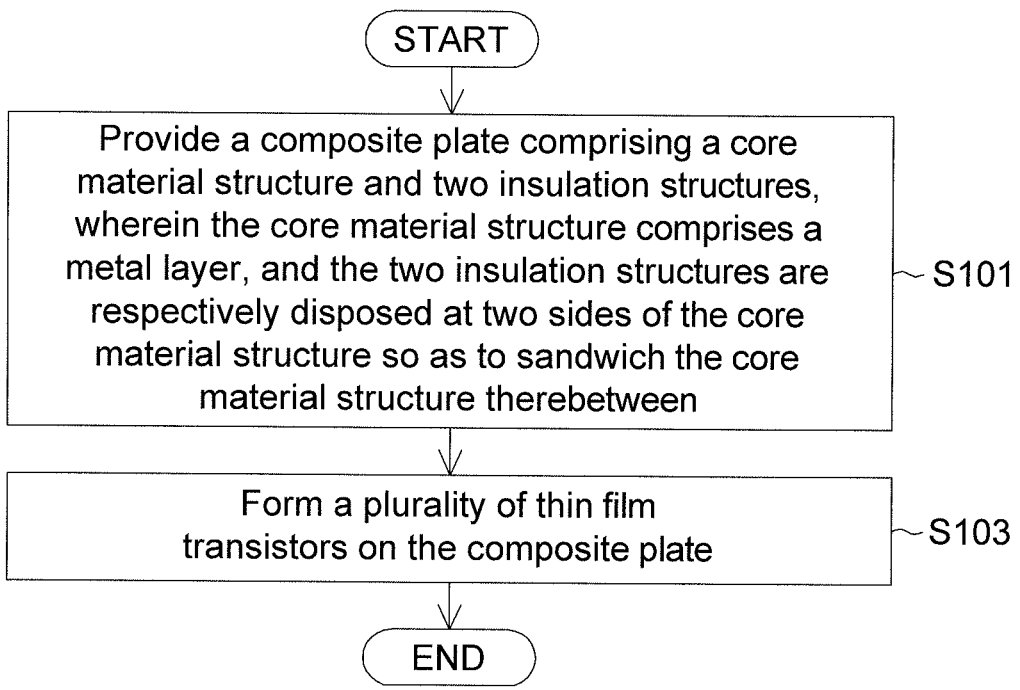
FIG. 3 shows a flowchart of a manufacturing method of a thin film transistor substrate according to the first embodiment of the invention.

Referring to FIG. 3, a flowchart of a manufacturing method of a thin film transistor substrate according to the first embodiment of the invention is shown. In the step S101, the composite plate 110 shown in FIG. 1 is provided. The disposition and material for each layer of the composite plate 110 are already disclosed above, and are not repeatedly described herein. Next, in the step S103, several thin film transistors 120 are formed on the composite plate 110. Thus, the manufacturing of the thin film transistor substrate 100a with the above advantages is completed.

Referring to FIG. 4, a cross-sectional view of a display apparatus according to the first embodiment of the invention is shown. The display apparatus 10 includes a top substrate 100b, a display medium layer 100c and the thin film transistor substrate 100a shown in FIG. 1. The disposition and material for each layer of the thin film transistor substrate 100a are already disclosed above, and are not repeatedly described herein. Since the display apparatus 10 includes the thin film transistor substrate 100a, a part of the display apparatus 10 possesses flexibility and impact resistance. The top substrate 100b, which is light permeable and can be used for carrying, conducting and coloring purposes, possesses water/oxygen resistance, impact resistance, stain resistance or touch. The top substrate 100b includes a main structure, which can be realized by a hard board, a soft board or a coating film. The top substrate 100b can selectively include a secondary structure such as a color filter, a patterned conductive layer, a touch sensing module, a surface hardening layer, a water/oxygen resistance layer or a combination thereof. The display medium layer 100c can be a liquid crystal layer, an electrophoretic (EP) layer, an electro wetting (EW) layer or a quick response liquid powder (QR-LP) layer. The display medium layer 100c is disposed between the thin film transistor substrate 100a and the top substrate 100b.

The manufacturing method of the display apparatus 10 includes the steps indicated in FIG. 3. Following the steps indicated in FIG. 3, the method further includes a step of providing the top substrate 100b and a step of forming the display medium layer 100c between the thin film transistor substrate 100a and the top substrate 100b. Thus, the manufacturing of the display apparatus 10 is completed.

Referring to FIG. 5, a cross-sectional view of another thin film transistor substrate according to the first embodiment of the invention is shown. In comparison to the thin film transistor substrate 100a in FIG. 1, the thin film transistor substrate 100a' in FIG. 5 further includes a planarization layer 130' and a protection layer 150'. The planarization layer 130' is disposed between the composite plate 110' and the thin film transistors 120' and other thin film structures. The planarization layer 130' can be ordinary photo resister or other organic polymer materials, and the thickness of the planarization layer 130' is about 1~2 μm. The planarization layer 130' is used for flattening the surface of the composite plate 110', so that the flatness on the surface reaches a level smaller than 10 nm to conform to the specifications of the manufacturing process of the thin film transistors 120'. In addition, the chemical resistance on the surface of the composite plate 110' can be enhanced, and the adhesion between the surface of the composite plate 110' and the coating film can also be enhanced, so that each coating film further can be easily adhered onto the surface of the plate and layer peeling can be avoided. The protection payer 150' is at least disposed at a lateral side of the composite plate 110'. Furthermore, the protection payer 150' of the present embodiment of the invention is disposed at the lateral side of the composite plate 110' and a lateral side of the planarization layer 130'. The protection payer 150' can be photo resister or an organic polymer material. In the present embodiment of the invention, after the planarization layer 130' completed, the protection payer 150' can be formed by existing edge read rinse (EBR). More specifically, the material for forming the protection payer 150' is filled into the storage cell of the edge read rinse. The edge read rinse moves around the peripheral of the composite plate 110' and the planarization layer 130' disposed thereon, the material can be coated at the lateral side of the composite plate 110' and the lateral side of the planarization layer 130' to form the protection payer 150'. Since the protection payer 150' can be made by the existing manufacturing equipment, the lateral side of the composite plate 110' possesses chemical resistance to increase the protection and the cost is low.

Figure 6:
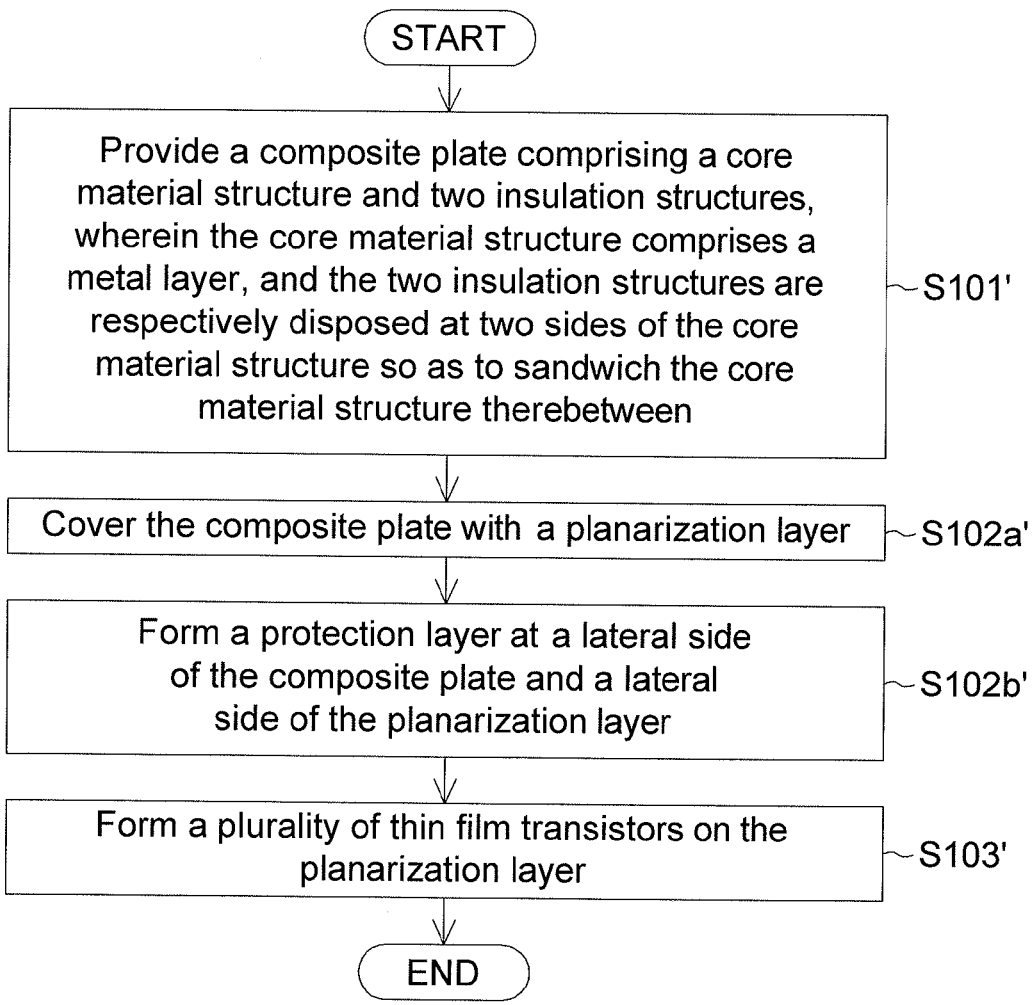
FIG. 6 shows a flowchart of a manufacturing method of another thin film transistor substrate according to the first embodiment of the invention.

Referring to FIG. 6, a flowchart of a manufacturing method of another thin film transistor substrate according to the first embodiment of the invention is shown. In the step S101', the composite plate 110' in FIG. 5 is provided. Next, in the step S102a', the composite plate 110' is covered with the planarization layer 130'. Then, in the step S102b', the protection payer 150' is formed at the lateral side of the composite plate 110' and the lateral side of the planarization layer 130'. Lastly, in the step S103', several thin film transistors 120' are formed on the planarization layer 130'. Thus, the thin film transistor substrate 100a' of the present embodiment of the invention is completed to possess the advantages similar to those of the thin film transistor substrate 100a in FIG. 3. Since the planarization layer 130' is disposed between the composite plate 110' and the thin film transistors 120', the planarization layer 130' can further provide a flattened surface to the composite plate 110' to enhance the adhesion between the composite plate 110' and the coating film as well as chemical resistance on the surface of composite plate 110'. Moreover, since the protection payer 150' is positioned at the lateral side of the composite plate 110' and the lateral side of the planarization layer 130', chemical resistance is enhanced both on the lateral side of the composite plate 110' and the lateral side of the planarization layer 130'.

Figure 7:
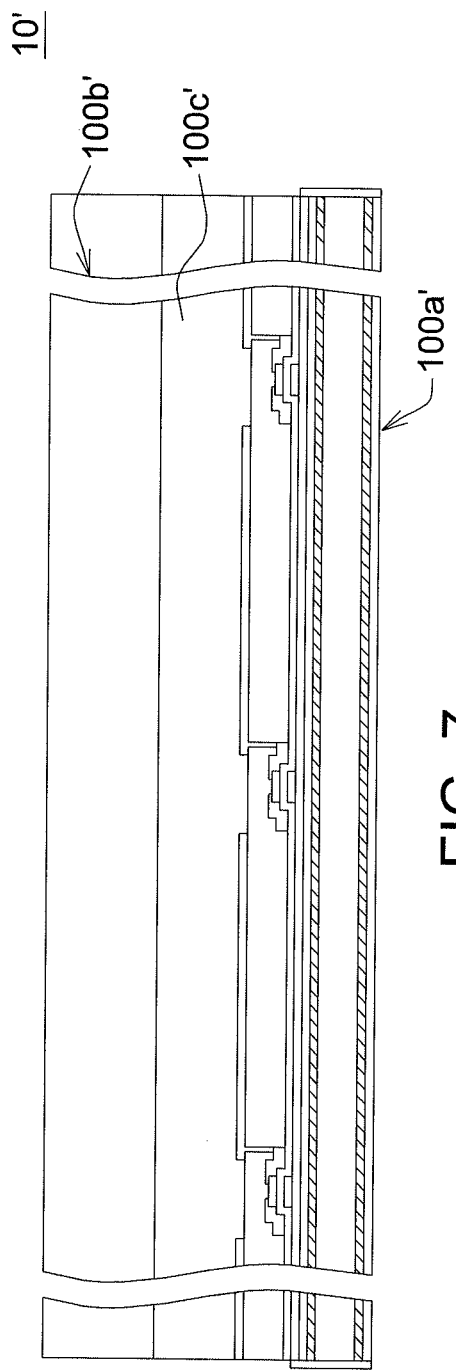
FIG. 7 shows a cross-sectional view of another display apparatus according to the first embodiment of the invention.

Referring to FIG. 7, a cross-sectional view of another display apparatus according to the first embodiment of the invention is shown. The display apparatus 10' includes a top substrate 100b', a display medium layer 100c' and the thin film transistor substrate 100a' in FIG. 5. The disposition of the thin film transistor substrate 100a', the top substrate 100b' and the display medium layer 100c' is similar to the thin film transistor substrate 100a, the top substrate 100b and the display medium layer 100c in FIG. 4, and is not repeatedly described herein.

The manufacturing method of the display apparatus 10' includes the steps indicated in FIG. 6. Following the steps indicated in FIG. 6, the method further includes a step of providing the top substrate 100b' and a step of forming the display medium layer 100c' between the thin film transistor substrate 100a' and the top substrate 100b'. Thus, the manufacturing of the display apparatus 10' is completed.

Second Embodiment

Figure 8:
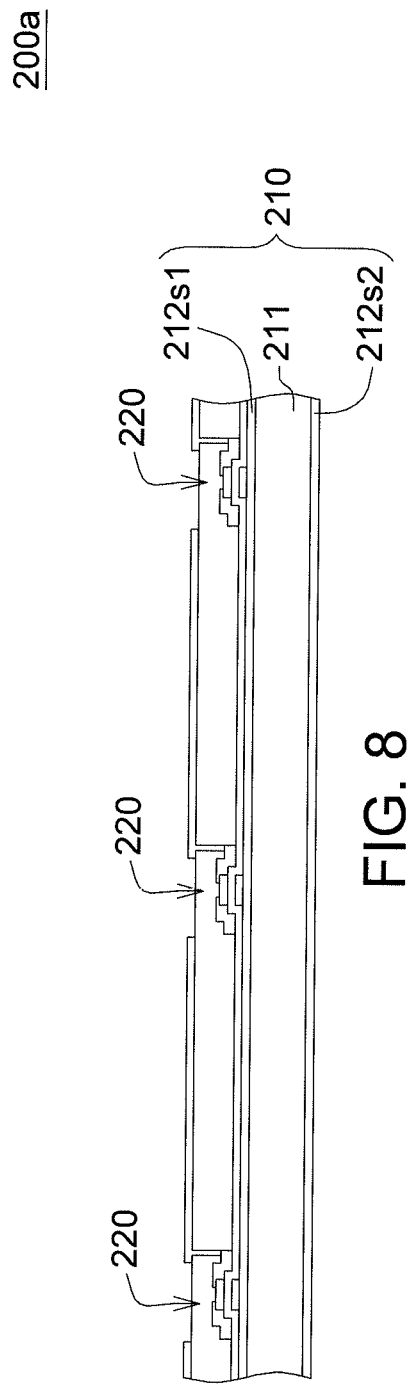
FIG. 8 shows a cross-sectional view of a thin film transistor substrate according to a second embodiment of the invention.

Referring to FIG. 8, a cross-sectional view of a thin film transistor substrate 200a according to a second embodiment of the invention is shown. In comparison to the thin film transistor substrate 100a of the first embodiment, the structure and material of the composite plate 210 of the thin film transistor substrate 200a of the present embodiment of the invention are different from those of the composite plate 110 of the thin film transistor substrate 100a of the first embodiment.

In the present embodiment of the invention, the composite plate 210 includes a core material structure 211 and two insulation structures 212s1 and 212s2. The insulation structures 212s1 and 212s2 are respectively disposed at two sides of the core material structure 211 so as to sandwich the core material structure 211 therebetween. The core material structure 211 of the present embodiment of the invention can be realized by a metal layer, and the several thin film transistors 220 are disposed on the composite plate 210.

In the present embodiment of the invention, the core material structure 211 being a metal layer can be made of metal alloy such as aluminum alloy, magnesium alloy or titanium alloy. Let aluminum alloy as an example, the core material structure 211 can be made of a material such as aluminum-magnesium alloy, aluminum-magnesium-silicon alloy or aluminum-zinc alloy, so that the performance of the core material structure 211 in rigidity and temperature resistance are similar to that of the glass material in rigidity and temperature resistance. In addition, the insulation structures 212s1 and 212s2 can be made from nano-level titanium dioxide ($TiO_2$) polymers, polyvinylidene fluoride (PVDF) or glass fiber fabric.

Referring to Table 2, the physical properties for the substrates with similar rigidity but different structures and materials are listed. Suppose the production line is 3.5 generation and the dimension of the substrate is 620 mm×750 mm, and the estimation values are obtained based on the Stoney's equation. The core material structure 211 of the composite plate 210 is made of aluminum-magnesium alloy, for example.

TABLE 2

| Type of the substrate | Physical property | |
| --- | --- | --- |
| | Thickness (mm) | Weight (g) |
| Glass substrate | 0.5 | 581 |
| Glass substrate | 0.6 | 697.2 |
| Glass substrate | 0.7 | 813.4 |
| Aluminum-magnesium alloy substrate | 0.5 | 628 |
| Aluminum-magnesium alloy substrate | 0.6 | 753 |
| The composite plate 210 (the thickness of the core material structure 211 made of aluminum-magnesium alloy is 0.5 mm, and the insulation structures 212s1 and 212s2 are made of glass fiber fabric and the total thickness equals 0.2 mm) | 0.7 | 814 |
| The composite plate 210 (the thickness of the core material structure 211 made of aluminum-magnesium alloy is 0.5 mm, and the insulation structures 212s1 and 212s2 are made of nano-level titanium dioxide polymers and the total thickness equals 0.06 mm) | 0.56 | 684 |

In Table 2, given that the rigidity is the same, the 0.5 mm aluminum-magnesium alloy substrate is slightly heavier than the 0.5 mm glass substrate. When the insulation structures 212s1 and 212s2 of the composite plate 210 are made of glass fiber fabric, the total thickness and weight of the composite plate 210 are equivalent to those of the 0.7 mm glass substrate. When the insulation structures 212s1 and 212s2 of the composite plate 210 are made of nano-level titanium dioxide polymers, the total thickness and weight of the composite plate 210 is slightly lower than those of the 0.6 mm glass substrate.

Two types of actual samples of the composite plate 210 are manufactured and elaborated below. In the first actual sample of the composite plate 210, the core material structure 211 is made of aluminum-magnesium alloy, and the thickness of the core material structure 211 is 0.5 mm. In addition, the insulation structures 212s1 and 212s2 are made of glass fiber fabric, and the total thickness of the insulation structures 212s1 and 212s2 is 0.16 mm. Under these conditions, the rigidity of the 0.66 mm composite plate 210 will be similar to that of the 0.5 mm glass substrate, and the weight of the composite plate 210 is about 777 g.

Figure 9:
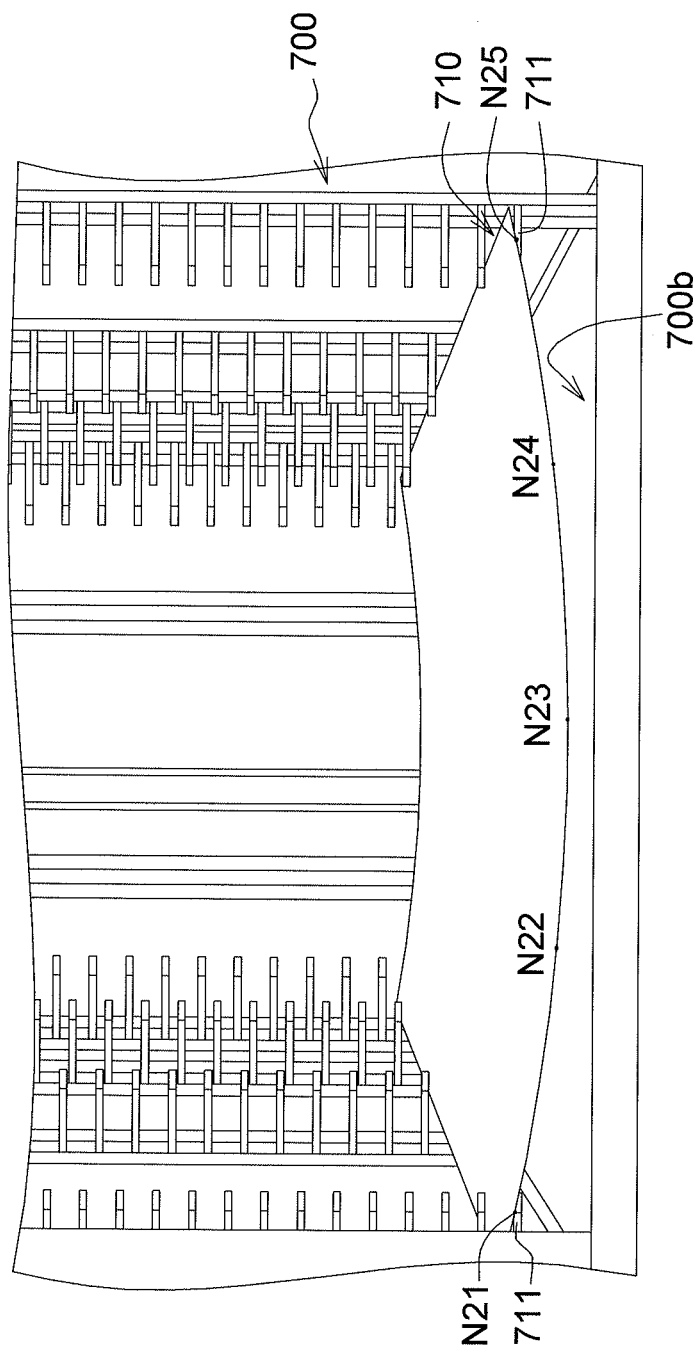
FIG. 9 shows a schematic diagram of the first actual sample of the composite plate being placed at a first cell of a cassette according to the second embodiment of the invention.

Referring to FIG. 9 and Table 3, a schematic diagram of the first actual sample of the composite plate 210 being placed at a first cell 710 of a cassette 700 according to the second embodiment of the invention is shown in FIG. 9, and the distances from the positions N21~N25 to the bottom 700b of the cassette 700 when the first actual sample of the composite plate 110 is placed at the first cell 710 of the cassette 700 are listed in Table 3.

TABLE 3

| | the first actual sample of the composite plate 210 | | | | |
| --- | --- | --- | --- | --- | --- |
| | Position N21 | Position N22 | Position N23 | Position N24 | Position N25 |
| Distance (mm) to the bottom 700b of the cassette 700 | 46.0 | 34.0 | 27.5 | 33.0 | 45.0 |

Two opposite sides of the first actual sample of the composite plate 210 are disposed at the supporting portions 711 of the first cell 710 of the cassette 700, so that the positions N21 and N25 of the first actual sample of the composite plate 210 respectively denote the positions at the supporting portions 711, and the position N23 denotes the central bending position of the first actual sample of the composite plate 210. The distance (27.5 mm) from the central bending portion (position N23) of the first actual sample of the composite plate 210 according to the present embodiment of the invention placed at the first cell 710 of the cassette 700 to the bottom 700b of the cassette 700 is within the predetermined specification (24~37 mm). In addition, the thickness of the first actual sample of the composite plate 210 is within the predetermined specification (0.1 mm~1.0 mm) for a substrate according to the requirement of the manufacturing process. Therefore, the composite plate 210 with the insulation structures 212s1 and 212s2 made of glass fiber fabric possesses the advantages similar to those of the composite plate 110 of the first embodiment.

In the second actual sample of the composite plate 210, the core material structure 211 is made of aluminum-magnesium alloy, and the thickness of the core material structure 211 is 0.6 mm. In addition, the insulation structures 212s1 and 212s2 are made of nano-level titanium dioxide polymers, and the total thickness of the insulation structures 212s1 and 212s2 is 0.06 mm. Thus, under these conditions, the rigidity of the 0.66 mm composite plate 210 is superior to that of the 0.5 mm glass substrate, and the weight of the composite plate 210 is about 809 g.

Figure 10:
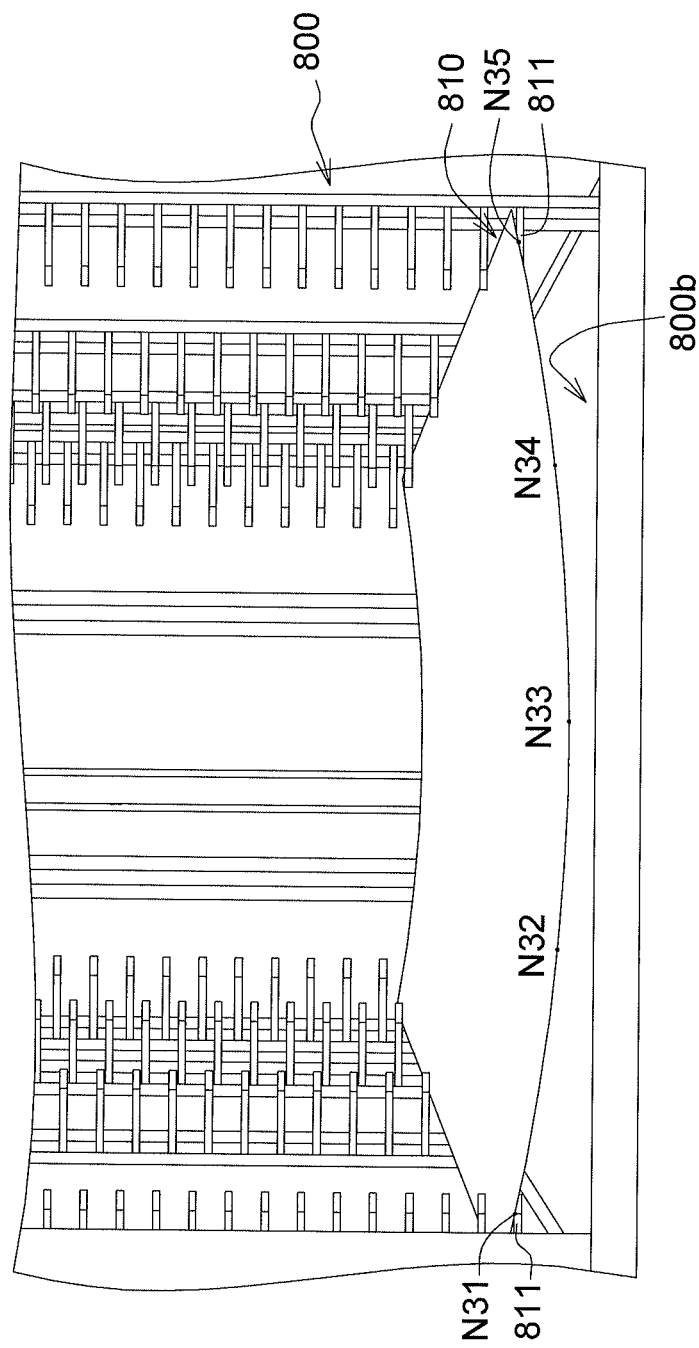
FIG. 10 shows a schematic diagram of the second actual sample of the composite plate being placed at a first cell of a cassette according to the second embodiment of the invention.

Referring to FIG. 10 and Table 4, a schematic diagram of the second actual sample of the composite plate 210 being placed at a first cell 810 of a cassette 800 according to the second embodiment of the invention is shown in FIG. 10, and the distances from the positions N31~N35 to the bottom 800b of the cassette 800 when the second actual sample of the composite plate 210 is placed at the first cell 810 of the cassette 800 are listed in Table 4.

TABLE 4

| the second actual sample of the composite plate 210 | | | | | |
|---|---|---|---|---|---|
| | Position N31 | Position N32 | Position N33 | Position N34 | Position N35 |
| Distance (mm) to the bottom 800b of the cassette 800 | 45.5 | 36.5 | 31.0 | 35.5 | 45.0 |

Two opposite sides of the second actual sample of the composite plate 210 are disposed at the supporting portions 811 of the first cell 810 of the cassette 800, so that the positions N31 and N35 of the second actual sample of the composite plate 210 respectively denote the positions at the supporting portions 811, and the position N33 denotes the central bending position of the second actual sample of the composite plate 210. The distance (31.0 mm) from the central bending portion (position N33) of the second actual sample of the composite plate 210 according to the present embodiment of the invention placed at the first cell 810 of the cassette 800 to the bottom 800b of the cassette 800 is within the predetermined specification (24~37 mm). In addition, the thickness of the second actual sample of the composite plate 210 is within the predetermined specification (0.1 mm~1.0 mm) for a substrate according to the requirement of the manufacturing process. Therefore, the composite plate 210 with the insulation structures 212s1 and 212s2 made of nano-level titanium dioxide polymers possesses the advantages similar to those of the composite plate 110 of the first embodiment.

Moreover, when the thickness of the core material structure 211 is 0.6 mm, the distance from the central bending position (position N33) of the second actual sample of the composite plate 210 to the bottom 800b of the cassette 800 is larger than that of the 0.5 mm glass substrate to the bottom 800b of the cassette 800 by about 2 mm. Thus, the thickness of the core material structure 211 can be reduced to 0.5 mm, so that the weight can be further reduced under the conditions that the specifications are satisfied.

The steps of the manufacturing method of the thin film transistor substrate 200a are similar to those of the thin film transistor substrate 100a in FIG. 3 of the first embodiment, and only the dissimilarities are disclosed below. In the present embodiment of the invention, the step of providing the composite plate 210 includes two steps which sequentially are anodizing the core material structure 211, and forming the insulation structures 212s1 and 212s2 at the two sides of the anodized core material structure 211 so as to sandwich the anodized core material structure 211 therebetween to form the composite plate 210. Next, several thin film transistors 220 are formed on the composite plate 210 to complete the manufacturing of the thin film transistor substrate 200a of the present embodiment of the invention, so that the thin film transistor substrate 200a has the above advantages.

Figure 11:
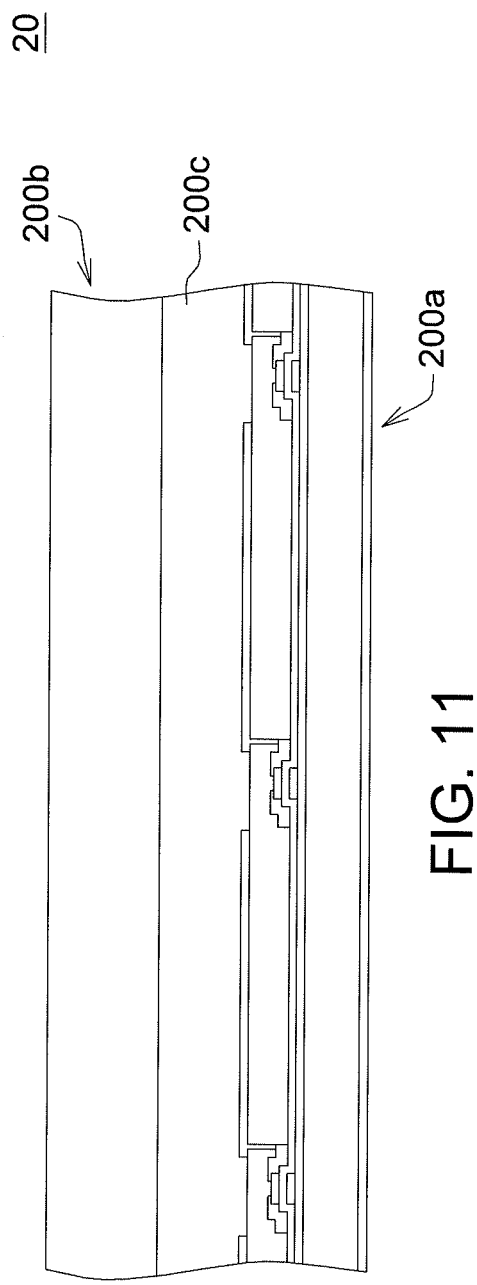
FIG. 11 shows a cross-sectional view of a display apparatus according to the second embodiment of the invention.

Referring to FIG. 11, a cross-sectional view of a display apparatus according to the second embodiment of the invention is shown. The display apparatus 20 includes a top substrate 200b, a display medium layer 200c and the thin film transistor substrate 200a in FIG. 8. The disposition and material of the thin film transistor substrate 200a are already disclosed above, and are not repeatedly described herein. The display apparatus 20 possesses flexibility and impact resistance. The top substrate 200b, which is light permeable and can be used for carrying, conducting and coloring purposes, possesses water/oxygen resistance, impact resistance, stain resistance or touch. The top substrate 200b includes a main structure, which can be a hard board, a soft board or a coating film. The top substrate 200b can selectively include a secondary structure, which can be a color filter, a patterned conductive layer, a touch sensing module, a surface hardening layer, a water oxygen resistance layer, or a combination thereof. The display medium layer 200c can be a liquid crystal layer, an electro-phoretic (EP) layer, an electro wetting (EW) layer or a quick response liquid powder (QR-LP) layer. The display medium layer 200c is disposed between the thin film transistor substrate 200a and the top substrate 200b.

The manufacturing method of the display apparatus 20 includes the steps of the manufacturing method of the thin film transistor substrate 200a. Following the steps of the manufacturing method of the thin film transistor substrate 200a, the manufacturing method of the display apparatus 20 further includes a step of providing the top substrate 200b and a step of forming a display medium layer 200c between the thin film transistor substrate 200a and the top substrate 200b. Thus, the manufacturing of the display apparatus 20 is completed.

Figure 12:
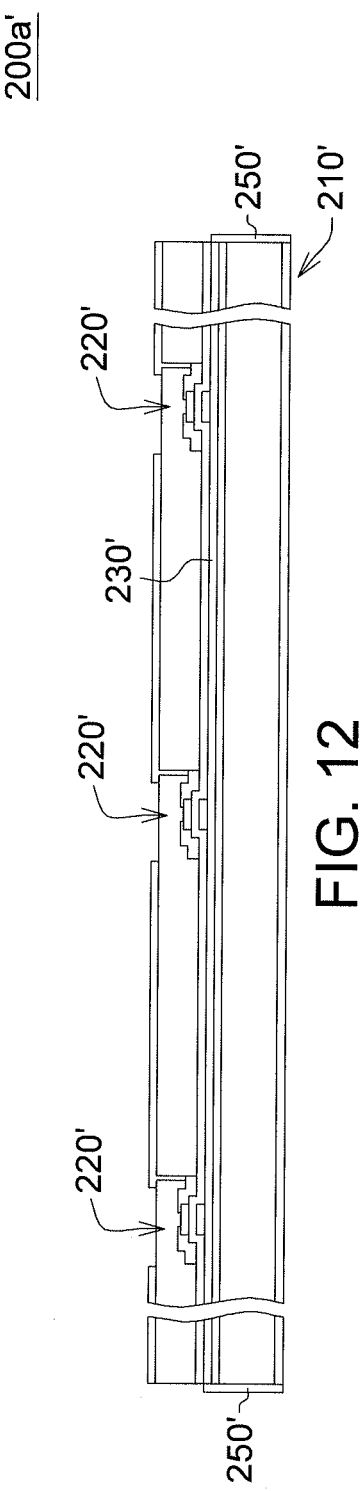
FIG. 12 shows a cross-sectional view of another thin film transistor substrate according to the second embodiment of the invention.

Referring to FIG. 12, a cross-sectional view of another thin film transistor substrate according to the second embodiment of the invention is shown. In comparison to the thin film transistor substrate 200a in FIG. 8, the thin film transistor substrate 200a' in FIG. 12 further includes a planarization layer 230' and a protection payer 250'. The planarization layer 230' is disposed between the composite plate 210' and the thin film transistors 120' and other thin film structures. The planarization layer 230' can be ordinary photo resister or other organic polymer materials, and the thickness of the planarization layer 230' is about 1~2 μm. The planarization layer 230' is used for flattening the surface of the composite plate 210', so that the flatness on the surface reaches a level smaller than 10 nm and is conformed to the specifications of the manufacturing process of the thin film transistor 120'. In addition, the chemical resistance on the surface of the composite plate 210' can be enhanced, and the adhesion between the surface of the composite plate 210' and the coating film can also be enhanced, so that each coating film further can be easily adhered onto the surface of the plate and layer peeling can be avoided. The protection payer 250' is at least disposed at a lateral side of the composite plate 210'. Furthermore, the protection payer 250' of the present embodiment of the invention is disposed at the lateral side of the composite plate 210' and a lateral side of the planarization layer 230'. The protection payer 250' can be photo resister or organic polymer material. The method for forming the protection payer 250' of the present embodiment of the invention is similar to that for forming the protection payer 150' of the first embodiment, and is not repeatedly described herein. The protection payer 250' can be made by the existing equipment, the lateral sides of the composite plate 210' and the planarization layer 230' possess chemical resistance to increase the protection of the structure and the cost is low.

In comparison to the manufacturing method of the thin film transistor substrate 200a, the manufacturing method of the thin film transistor substrate 200a' further includes a step of covering the composite plate 210' with the planarization layer 230' and forming the protection payer 250' at the lateral side of the composite plate 210' and the lateral side of the planarization layer 230' before to the step of forming the thin film transistors 220'. Lastly, the thin film transistors 220' are formed on the planarization layer 230'. Thus, the thin film transistor substrate 200' of the present embodiment of the invention possessing the above advantages is completed.

Figure 13:
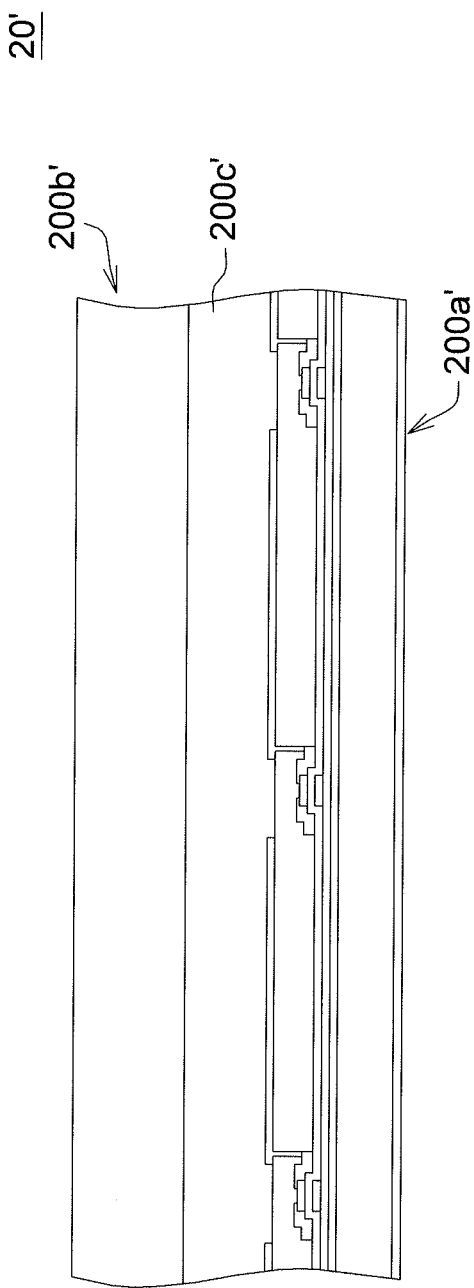
FIG. 13 shows a cross-sectional view of another display apparatus according to the second embodiment of the invention.

Referring to FIG. 13, a cross-sectional view of another display apparatus according to the second embodiment of the invention is shown. The display apparatus 20' includes a top substrate 200b', a display medium layer 200c' and the thin film transistor substrate 200a' in FIG. 12. The disposition of the thin film transistor substrate 200a', the top substrate 200b' and the display medium layer 200c' is similar to that of the thin film transistor substrate 200a, the top substrate 200b and the display medium layer 200c in FIG. 11, and is not repeatedly described herein. The manufacturing method of the display apparatus 20' is similar to the manufacturing method of the display apparatus 20 except that the manufacturing method of the display apparatus 20' further includes a step of covering the composite plate 210' with the planarization layer 230' and a step of forming the protection payer 250' at the lateral side of the composite plate 210' and the lateral side of the planarization layer 230'. Then, the thin film transistors 220' are formed on the planarization layer 230' and the manufacturing of the thin film transistor substrate 200a' is completed. The remaining steps are not repeatedly described herein.

According to the thin film transistor substrate, the display apparatus using the same and the manufacturing method thereof disclosed in the above embodiments of the invention, the thin film transistors are carried by the composite plate of the thin film transistor substrate. Through the structural disposition and material selection, the composite plate can be manufactured in a manner of mass production without changing existing manufacturing equipment and specifications. Therefore, the composite plate can replace the glass substrate.

While the invention has been described by way of example and in terms of the embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thin film transistor substrate, comprising:
    a composite plate, comprising:
        a core material structure comprising:
            a metal layer;
            an insulation layer; and
            another metal layer, wherein the metal layer and the another metal layer are respectively disposed at two sides of the insulation layer so as to sandwich the insulation layer therebetween; and
        two insulation structures respectively disposed at two sides of the core material structure so as to sandwich the core material structure therebetween, wherein the ratio of the total thickness of the metal layer and the another metal layer to the total thickness of the two insulation structures and the insulation layer is 1:10; and
    a plurality of thin film transistors disposed on the composite plate.

2. The thin film transistor substrate according to claim 1, wherein the ratio of the thickness of the insulation layer to the total thickness of the two insulation structures ranges between 4.7~5.3:1.

3. The thin film transistor substrate according to claim 1, further comprising:
    a planarization layer disposed between the composite plate and the thin film transistors.

4. The thin film transistor substrate according to claim 1, further comprising:
    a protection layer at least disposed at a lateral side of the composite plate.

5. The thin film transistor substrate of claim 1, wherein the insulation structures are made from nano-level titanium dioxide ($TiO_2$) polymers, polyvinylidene fluoride (PVDF) or glass fiber fabric.

6. A display apparatus, comprising:
    a thin film transistor substrate, comprising:
        a composite plate, comprising:
            a core material structure comprising a metal layer;
            an insulation layer; and
            another metal layer, wherein the metal layer and the another metal layer are respectively disposed at two sides of the insulation layer so as to sandwich the insulation layer therebetween; and
        two insulation structures respectively disposed at two sides of the core material structure so as to sandwich the core material structure therebetween, wherein the ratio of the total thickness of the metal layer and the another metal layer to the total thickness of the two insulation structures and the insulation layer is 1:10; and
    a plurality of thin film transistors disposed on the composite plate;
    a top substrate; and
    a display medium layer disposed between the thin film transistor substrate and the top substrate.

7. The display apparatus according to claim 6, wherein the ratio of the thickness of the insulation layer to the total thickness of the two insulation structures ranges between 4.7~5.3:1.

8. The display apparatus according to claim 6, wherein the thin film transistor substrate further comprises:
    a planarization layer disposed between the composite plate and the thin film transistors.

9. The display apparatus according to claim 6, wherein the thin film transistor substrate further comprises:
    a protection layer at least disposed at a lateral side of the composite plate.

10. A manufacturing method of a display apparatus, comprising:
    providing a composite plate comprising a core material structure and two insulation structures, wherein the core material structure comprises a metal layer, an insulation layer and another metal layer, the metal layer and the another metal layer are respectively disposed at two sides of the insulation layer so as to sandwich the insulation layer therebetween, and the two insulation structures are respectively disposed at two sides of the core material structure so as to sandwich the core material structure therebetween, and wherein the ratio of the total thickness of the metal layer and the another metal layer to the total thickness of the two insulation structures and the insulation layer is 1:10;

forming a plurality of thin film transistors on the composite plate so as to form a thin film transistor substrate;

providing a top substrate; and forming a display medium layer between the thin film transistor substrate and the top substrate.

11. The manufacturing method of the display apparatus according to claim 10, wherein in the step of providing the composite plate, the ratio of the thickness of the insulation layer to the total thickness of the two insulation structures ranges between 4.7~5.3:1.

12. The manufacturing method of the display apparatus according to claim 10, wherein before the step of forming the thin film transistors on the composite plate, the manufacturing method of the display apparatus further comprises:

covering the composite plate with a planarization layer so that the planarization layer is disposed between the composite plate and the thin film transistors.

13. The manufacturing method of the display apparatus according to claim 10, wherein before the step of forming the thin film transistors on the composite plate, the manufacturing method of display apparatus further comprises:

forming a protection layer at a lateral side of the composite plate.

* * * * *